(12) United States Patent
Yu et al.

(10) Patent No.: US 10,317,633 B2
(45) Date of Patent: Jun. 11, 2019

(54) SFP TRANSCEIVER EQUIPPED WITH DEEP DRAWN METAL EMI SLEEVE AROUND MATING PORTION OF LENS MODULE

(71) Applicant: FOXCONN INTERCONNECT TECHNOLOGY LIMITED, Grand Cayman (KY)

(72) Inventors: Paul Yu, Sunnyvale, CA (US); David Meadowcroft, San Jose, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/448,555

(22) Filed: Mar. 2, 2017

(65) Prior Publication Data

US 2017/0254973 A1    Sep. 7, 2017

Related U.S. Application Data

(60) Provisional application No. 62/302,200, filed on Mar. 2, 2016.

(51) Int. Cl.
| | |
|---|---|
| *G02B 6/42* | (2006.01) |
| *H05K 9/00* | (2006.01) |
| *H01R 13/6581* | (2011.01) |
| *H05K 7/14* | (2006.01) |

(52) U.S. Cl.
CPC ......... *G02B 6/4277* (2013.01); *G02B 6/4206* (2013.01); *G02B 6/428* (2013.01); *G02B 6/4244* (2013.01); *H01R 13/6581* (2013.01); *H05K 7/1427* (2013.01); *H05K 9/0037* (2013.01); *H05K 9/0058* (2013.01)

(58) Field of Classification Search
CPC ... G02B 6/42; H05K 9/00; H05K 7/14; H01R 13/6581
See application file for complete search history.

(56) References Cited

U.S. PATENT DOCUMENTS

| | | | | |
|---|---|---|---|---|
| 4,840,451 A | * | 6/1989 | Sampson | G02B 6/4277 385/88 |
| 7,762,729 B2 | * | 7/2010 | Teo | G02B 6/4246 250/515.1 |

(Continued)

FOREIGN PATENT DOCUMENTS

JP    2006228448 A    8/2006

*Primary Examiner* — Ryan A Lepisto
*Assistant Examiner* — Erin D Chiem
(74) *Attorney, Agent, or Firm* — Wei Te Chung; Ming Chieh Chang

(57) ABSTRACT

An SFP transceiver with a die-casting metal housing and a metallic upper cover formed via sheet metal and assembled to the housing to commonly form therebetween a receiving cavity in which a printed circuit board assembly is received. The printed circuit board assembly includes an optical module with a lens structure, around a mating port, including a front face with a pair of tubular structures extending forwardly. A metallic EMI shielding device includes a plate with a pair of sleeves unitarily extending therefrom via a deep drawing method to cover the front face and the tubular structures, respectively. Each sleeve further includes a flange to cover a ring type front end face of the corresponding tubular structure in the front-to-back direction.

20 Claims, 22 Drawing Sheets

(56) References Cited

U.S. PATENT DOCUMENTS

| | | | | |
|---|---|---|---|---|
| 2007/0117458 A1* | 5/2007 | Winker | ............... | G02B 6/4201 |
| | | | | 439/607.01 |
| 2009/0092362 A1* | 4/2009 | Mizue | ................... | G02B 6/423 |
| | | | | 385/92 |
| 2013/0028589 A1* | 1/2013 | Zung | ................ | H01L 27/14618 |
| | | | | 396/529 |

* cited by examiner

SFP TRANSCEIVER EQUIPPED WITH DEEP DRAWN METAL EMI SLEEVE AROUND MATING PORTION OF LENS MODULE

BACKGROUND OF THE INVENTION

1. Field of the Invention

The invention relates to an EMI sleeve additionally used in the transceiver SFP (Small Form Factor Pluggable), and particularly to the structural relation between the existing insulative sleeve and the new EMI metallic sleeve attached upon the insulative sleeve.

2. Description of Related Art

As cost-pressures increase, it is pretty standard practice now for plastic optical lenses to be used in SFP+ and other transceivers as molded plastic piece parts tend to a lot cheaper than metal TO (transistor outline) can (TO-can) optical sub-assembly solutions. However, as data rates and port density increase, electromagnetic interference (EMI) is becoming more and more problematic. As shown in FIG. 15, in a typical SFP+ transceiver design, there is usually a metal housing 151 of some sort that encapsulates the electrical-optical subassemblies (EOSA) of the transceiver. An EMI collar 152 helps to reduce emissions from around the module. However, as the optics are usually made of plastic for cost reasons, the plastic lenses 153 create quite a large aperture 154 from which EMI emission can escape.

As shown in FIG. 16 which shows side by side a prior art design and a design in accordance with the present invention, in a typical SFP+ transceiver design on the left side of the drawing figure, the length of the leakage aperture is indicated by A1, the length A1 is much smaller than the length of the lenses, and the minimum aperture size B1 is substantially the same as the diameter of the lenses. At lower data rates the large apertures size was tolerable, but at data rate such at 25G or 28G the leakage is untenable. Thus there exists a great need to find a way to either decrease the aperture size, and/or increase the length through which the emissions must escape through as that will help to minimize their effect.

At the same time, the solution must be cheap, and also precise enough such that introducing an extra piece part does not cause the assembly to violate any FOCIS (Fiber Optic Connector Intermateability Standard) or MSA (Multi-source Agreement) specifications. It should be assured that the improved solution will work with all existing complementary optical connectors.

The invention relates to a solution to the aforementioned issue by using a deep drawn metallic EMI sleeve that will help to not only decrease the aperture (diametrical) size but also increase the shielding length through which the emission must radiate through, and further is able to meet FOCIS and MSA specification without compromising cable assembly interoperability thereof.

SUMMARY OF THE INVENTION

Accordingly, the object of the present invention is to design a piece part to reduce electromagnetic interference (EMI) from a module that is both low cost and able to maintain tight tolerances to meet FOCIS and MSA specifications. The invention provides an SFP transceiver with a die-casting metal housing and a metallic upper cover formed via sheet metal and assembled to the housing to commonly form therebetween a receiving cavity in which a printed circuit board assembly is received. The printed circuit board assembly includes an optical module with a lens structure, around a mating port, including a front face with a pair of tubular structures extending forwardly. A metallic EMI shielding device includes a plate with a pair of sleeves unitarily extending therefrom via a deep drawing method to cover the front face and the tubular structures, respectively. Each sleeve further includes a flange to cover a ring type front end face of the corresponding tubular structure in the front-to-back direction.

DETAILED DESCRIPTION OF THE PREFERRED EMBODIMENT

Figure 1:
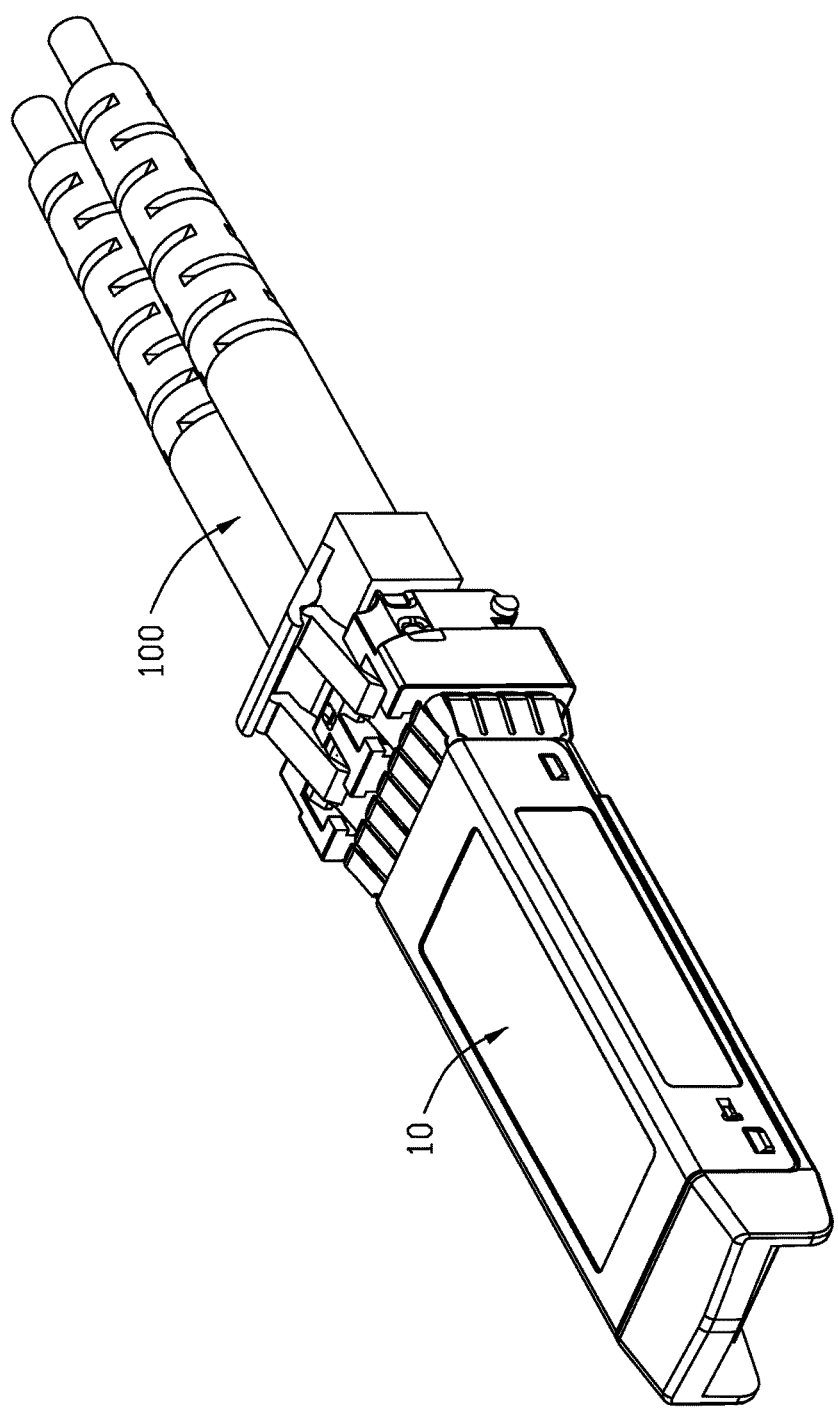
FIG. 1 is a perspective view of an optical assembly including an SFP+ transceiver and the LC type optical connector mated with each other.
Figure 2:
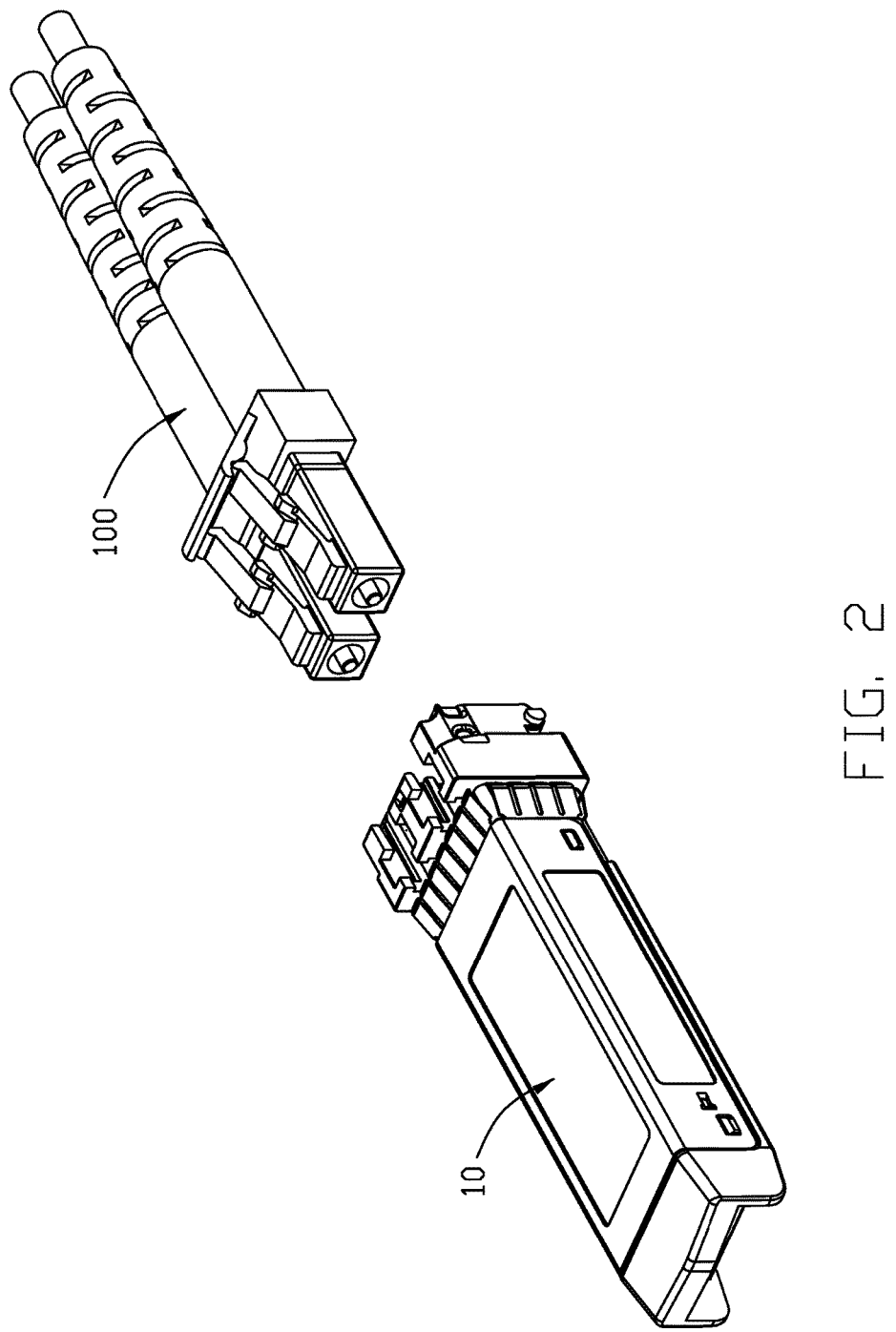
FIG. 2 is a perspective view to show the SFP+ transceiver and the LC type optical connector of FIG. 1 in a separated manner.
Figure 3:
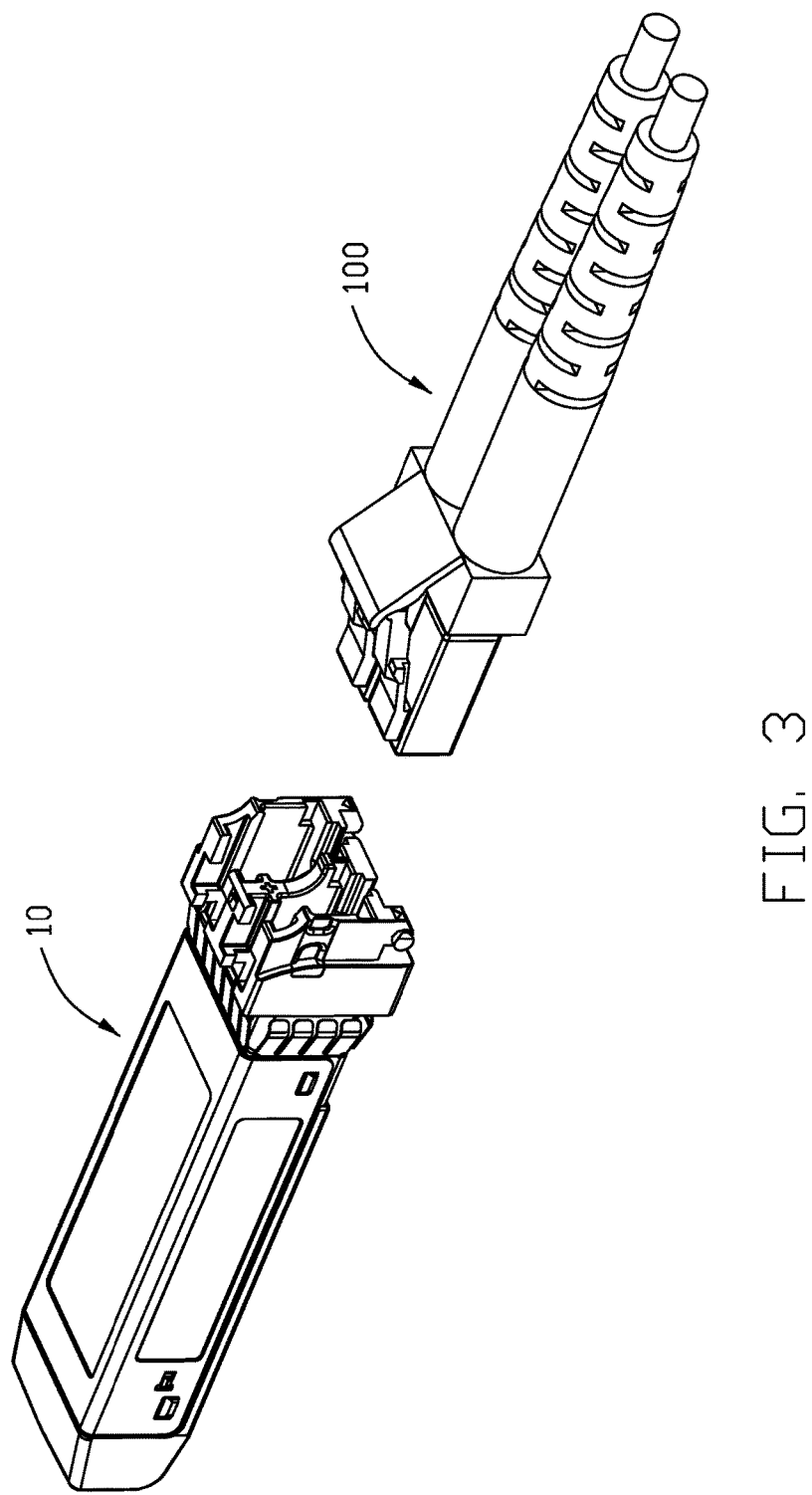
FIG. 3 is another perspective view of the SFP+ transceiver and the LC type optical connector of FIG. 2.

Reference will now be made in detail to the preferred embodiment of the present invention. Referring to FIGS. 1-14(B), a SFP (Small Form Factor Pluggable) transceiver 10 is adapted to be mated with an LC type optical connector 100. The transceiver 10 adapted to be received in a metallic cage (not shown) mounted upon a printed circuit board (not shown), includes a metallic die-casting housing 20 including a mating port 22 located around a front opening of the aforementioned cage for coupling to the LC type optical connector 100, and a connecting port 24 located at a rear end of the aforementioned cage for connecting to a corresponding electrical card edge type connector mounted upon the aforementioned printed circuit board. Notably, the housing 20 is equipped with a locking lug 26 adapted to be locked within a locking hole of the aforementioned cage, and a slider 28 adapted to be actuated to move along a front-to-back direction for releasing the locking lug 26 from the aforementioned locking hole. Notably, the releasing mechanism for actuating the slider 28 is now shown.

A metallic upper cover 50 formed by sheet metal for low cost is assembled to the housing 20 and cooperate with the housing to form a receiving cavity therebetween. A printed circuit board assembly 30 is disposed in the cavity, including a printed circuit board 31, an optical-electro (OE) module 32 for coupling to the LC type optical connector, at a front end and a plurality of conductive pads 34 at the rear end for connecting to the aforementioned card edge connector. Understandably, the OE module 32 includes a lens structure 36 with a 45-degree reflection structure for coupling to the LC type optical connector 100 for transmitting/receiving the optical signals between the LC type optical connector and the printed circuit board 31. A metallic grounding collar 60 is attached upon the assembled housing 20 and upper cover 50 for coupling to an interior of the aforementioned cage.

Figure 14:
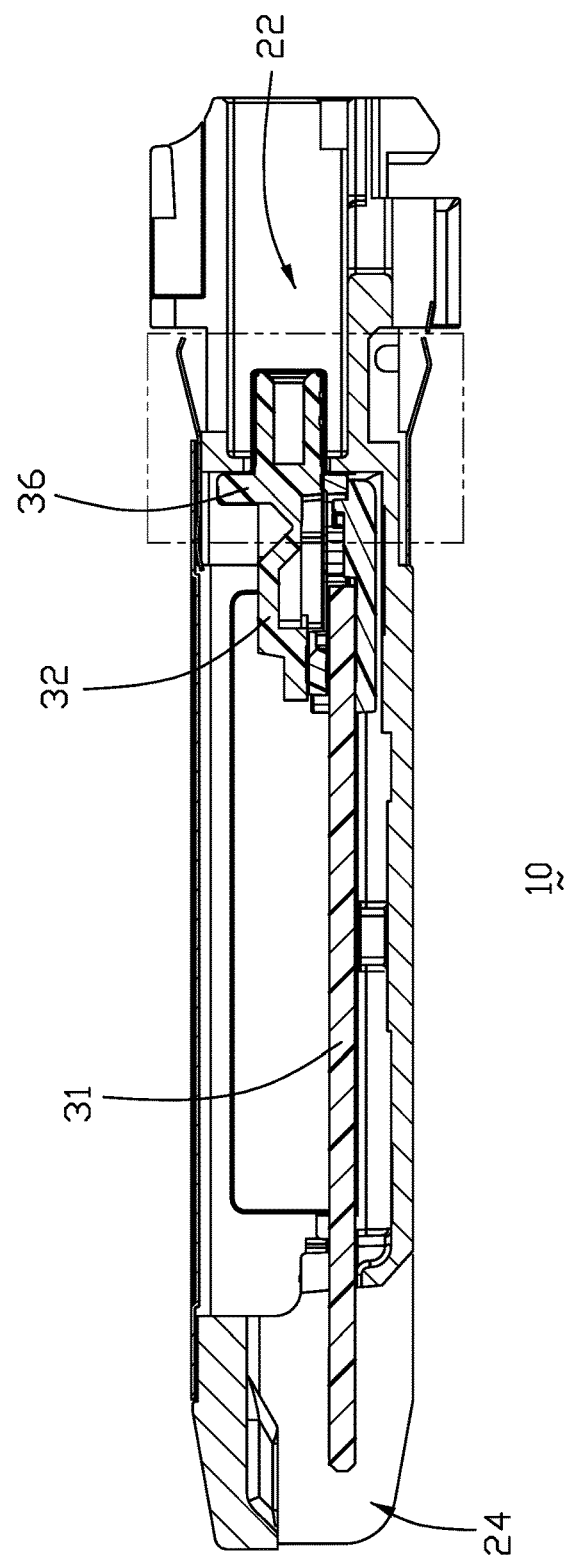
FIG. 14 is a cross-sectional view of the SFP+ transceiver of FIG. 5.
Figure 14A:
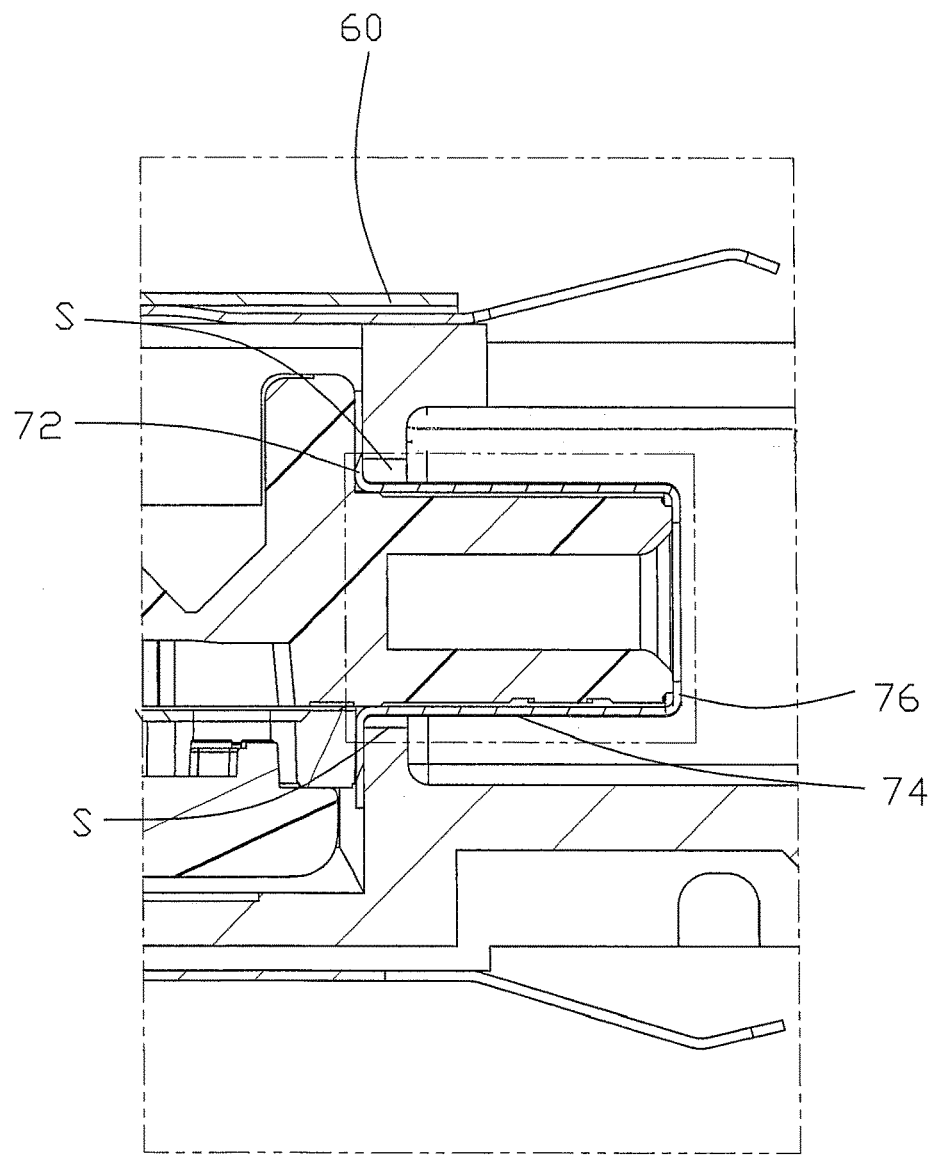
FIG. 14(A) is a partially enlarged cross-sectional view of the SFP+ transceiver of FIG. 14.
Figure 16:
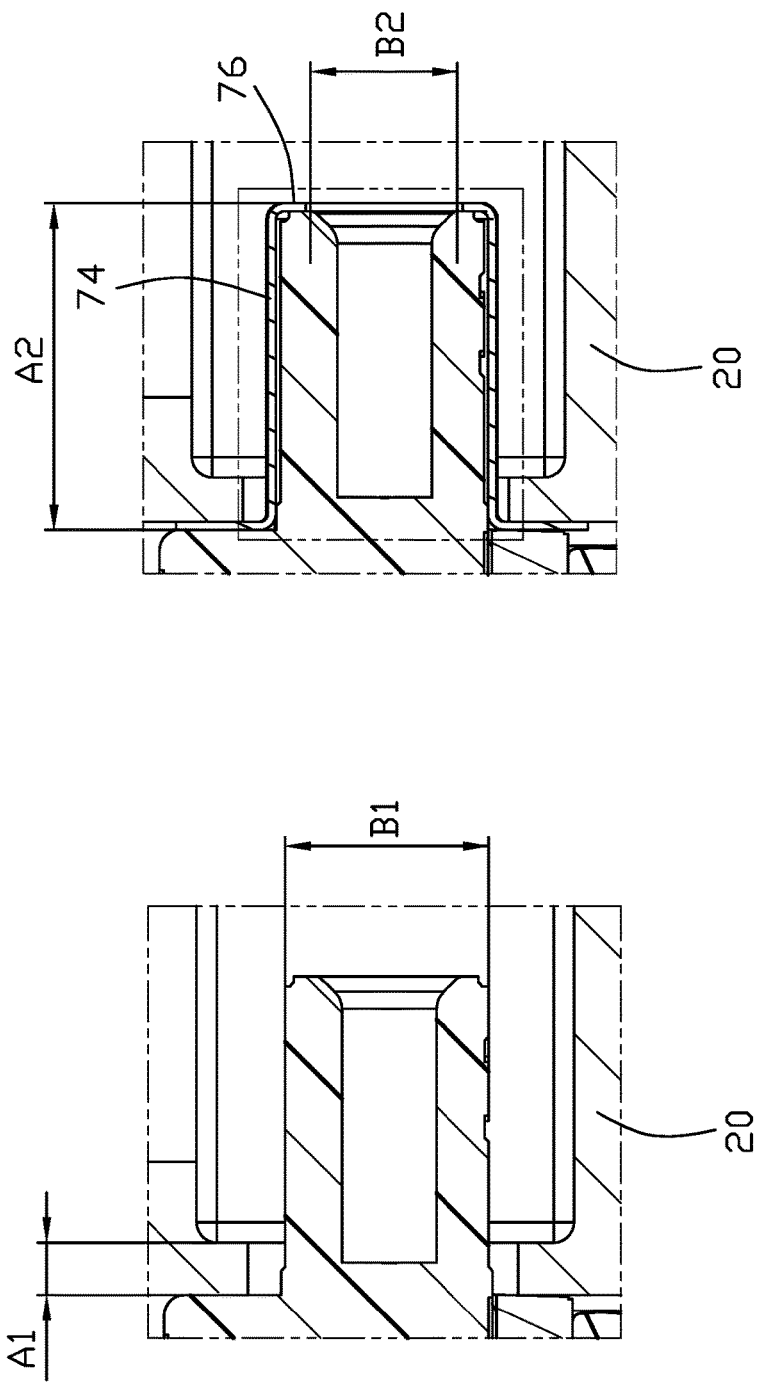
FIG. 16 shows the sleeve enclosing the tubular structure.

Notably, the lens structure 36 includes a forward face 38 with a pair of tubular structures 40 extending forwardly to couple to the corresponding LC type optical connector 100. Compared with the prior art, the invention provides a metallic EMI shielding device 70 including a pair of plates 72 respectively with a pair of tubular sleeves 74 extending therefrom via deep drawing to cover the corresponding forward face 38 and the whole tubular structures 40 circumferentially and continuously and fully. Understandably, the pair of plates 72 may be unified together as one piece, if necessary. In this embodiment, both the tubular structure 40 and the tubular sleeve 74 are cylindrical compliantly, the tubular sleeves 74 are respectively exposed outside of the tubular structures 40, and the tubular sleeve 74 is further equipped with a flange 76 to cover the ring type front end face 42 of the tubular structure 40 so as to minimize the possible leakage aperture (diametrical) size (as shown in FIG. 16, in the present invention design, the minimum aperture size is indicated by B2, the minimum aperture size B2 is substantially smaller than the diameter of the lenses for the flange 76 of the tubular sleeves 74). Understandably, compared with the prior art, around the mating port the tubular sleeve 74 provides the complete EMI shielding effect along its axial direction while the prior art only provides such a relatively short length indicated as A in FIG. 14(A) (as shown in FIG. 16, in the present invention design, the length of the leakage aperture indicated by A2, the length of A2 is substantially the same as the length of the tubular sleeves 74). On the other hand, the plate 72 also shields the possible leakage around the gap S along the front-to-back direction.

Figure 17:
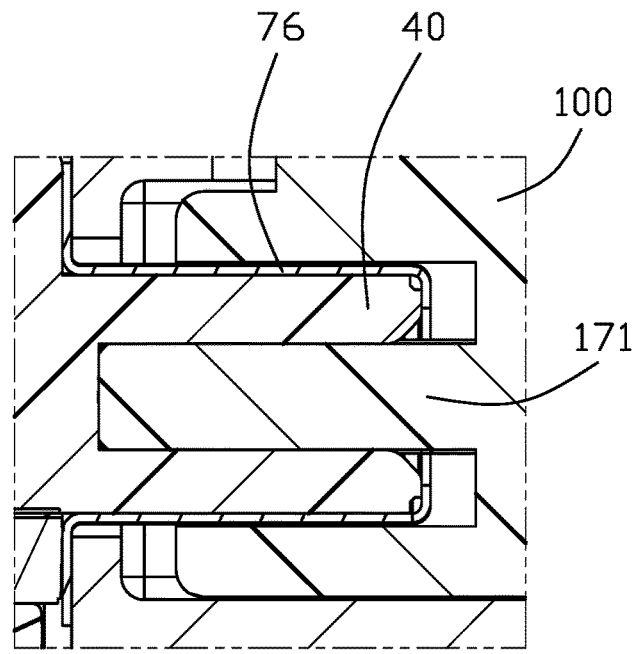
FIG. 17 shows the concerns occurring between the sleeve and the tubular structure.
Figure 18:
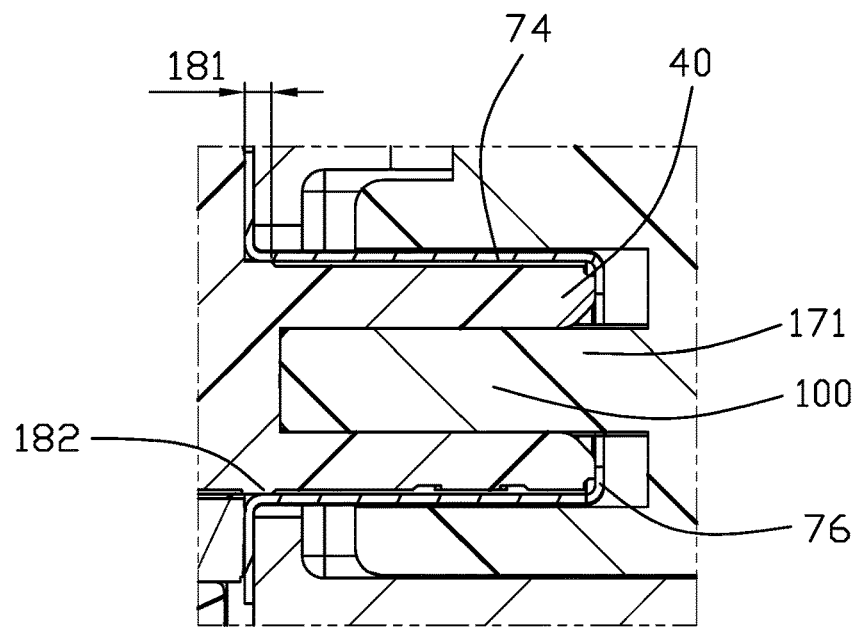
FIG. 18 shows the solution to the aforementioned concerns.

Referring to FIG. 17, shows the concerns occurring between the tubular sleeve 74 and the tubular structure 40. FOCIS standard expects the positional tolerance between the outer diameter of the tubular structure 40 and the inner diameter to be within +/−25 microns. This is not possible unless there is an interference fit between the tubular sleeve 74 and the tubular structure 40. The interference fit between the tubular sleeve 74 and the tubular structure 40 can deform the plastic enough such that the fiber ferrules 171 of the LC type optical connector 100 cannot reliably be insert all the way into the tubular structure 40, which could cause optical coupling issues. Referring to FIG. 18, to solve this issue, the tubular structure 40 is modified such that the mating section (and thus tightness) is only experienced on a short portion of the entire length of the tubular structure 40. Moving the mating section completed clear from where the fiber ferrules 171 needs to insert would completely remove the danger of the fiber ferrules 171. By defining a mating section 181, we can also control the mating section 181 of the tubular sleeve 74 to tighter tolerance than the rest of the length of the tubular structure 40.

Figure 4:
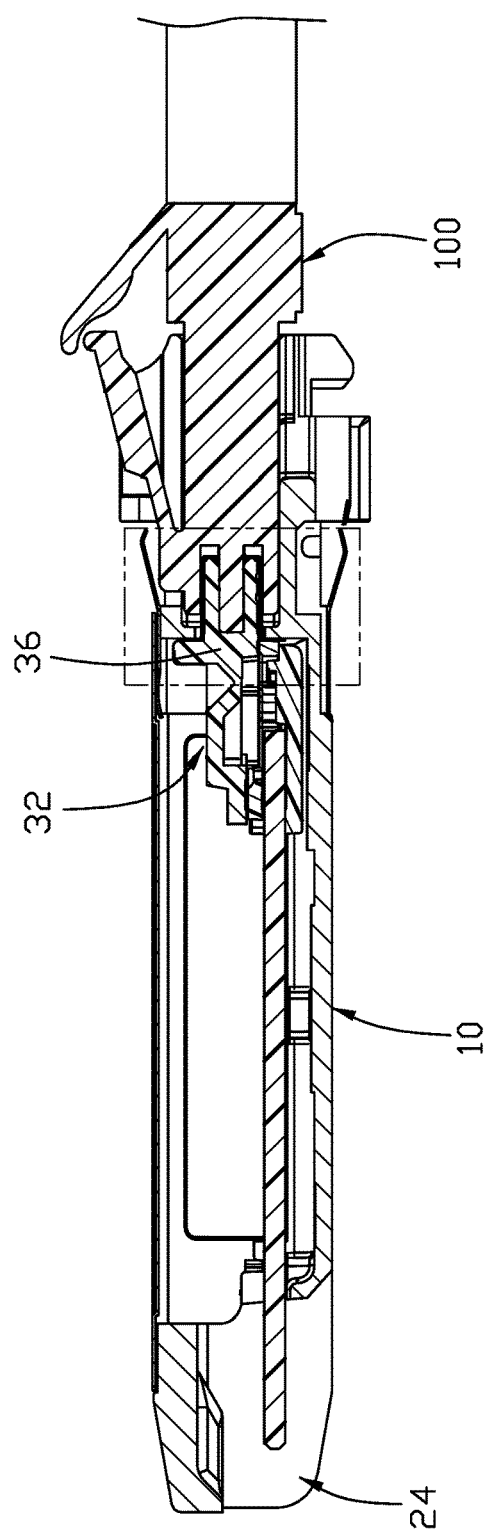
FIG. 4 is a cross-sectional view of the assembled SFP+ transceiver and LC type optical connector of FIG. 1
Figure 4A:
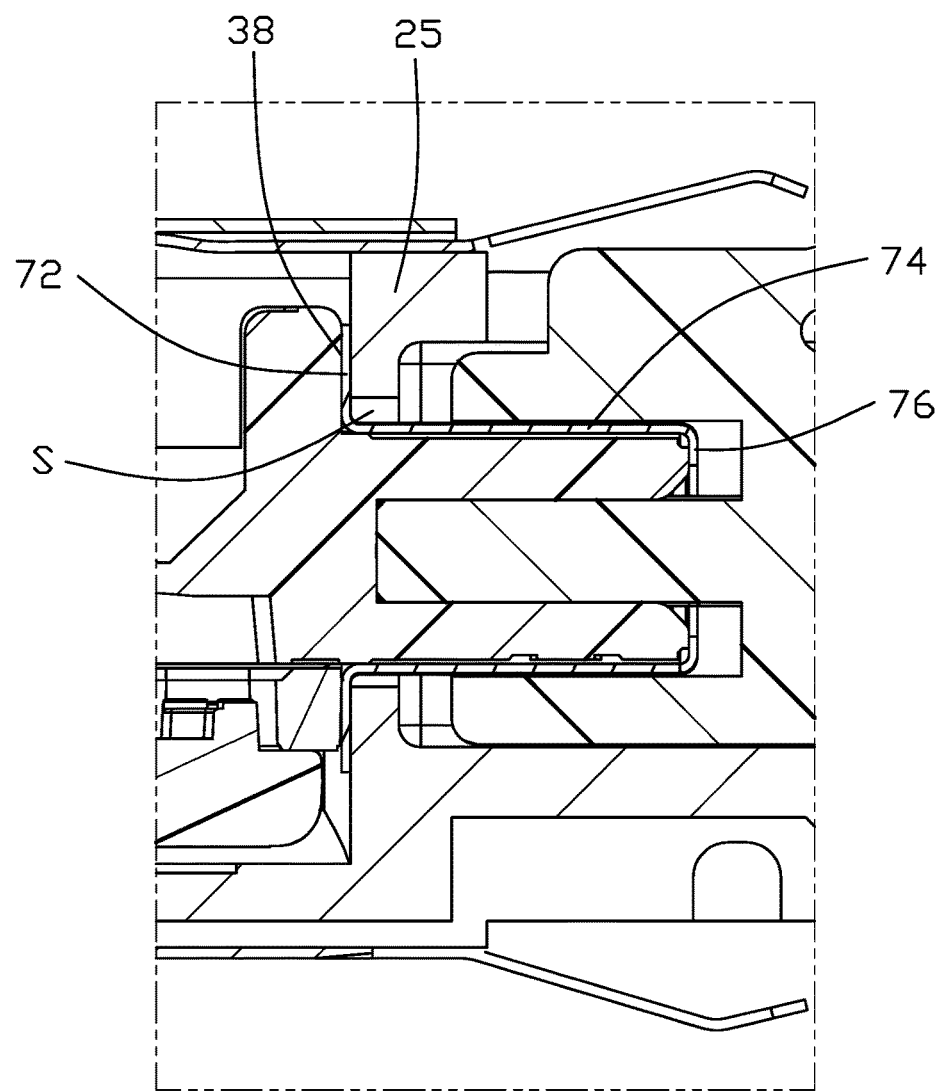
FIG. 4(A) is a partially enlarged cross-sectional view of the assembled SFP+ transceiver and LC type optical connector of FIG. 4.
Figure 5:
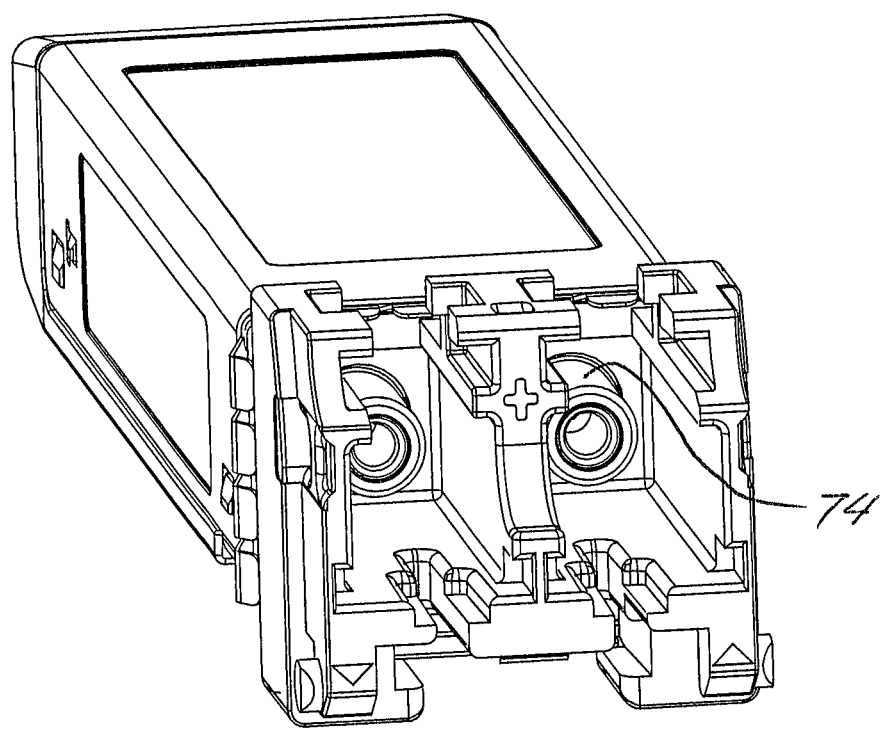
FIG. 5 is a front perspective view of the SFP+ transceiver of FIG. 1.
Figure 6:
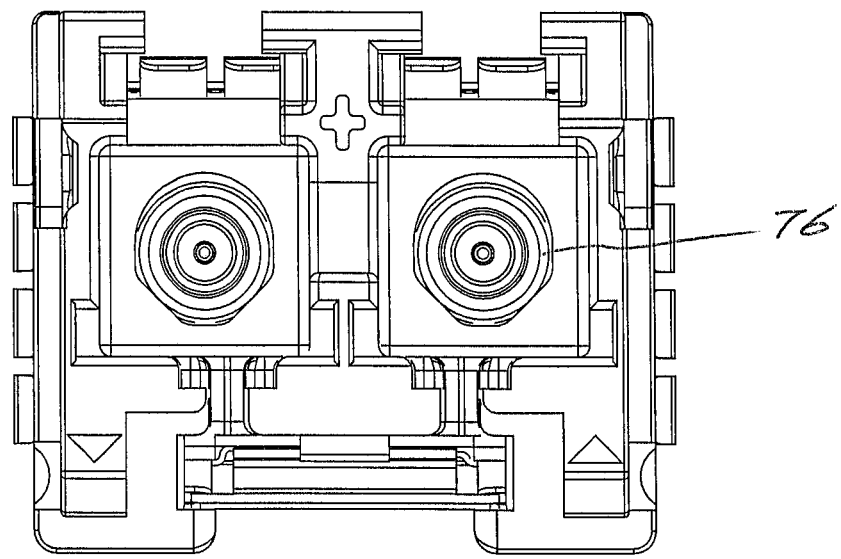
FIG. 6 is a front view of the SFP+ transceiver of FIG. 5.
Figure 7:
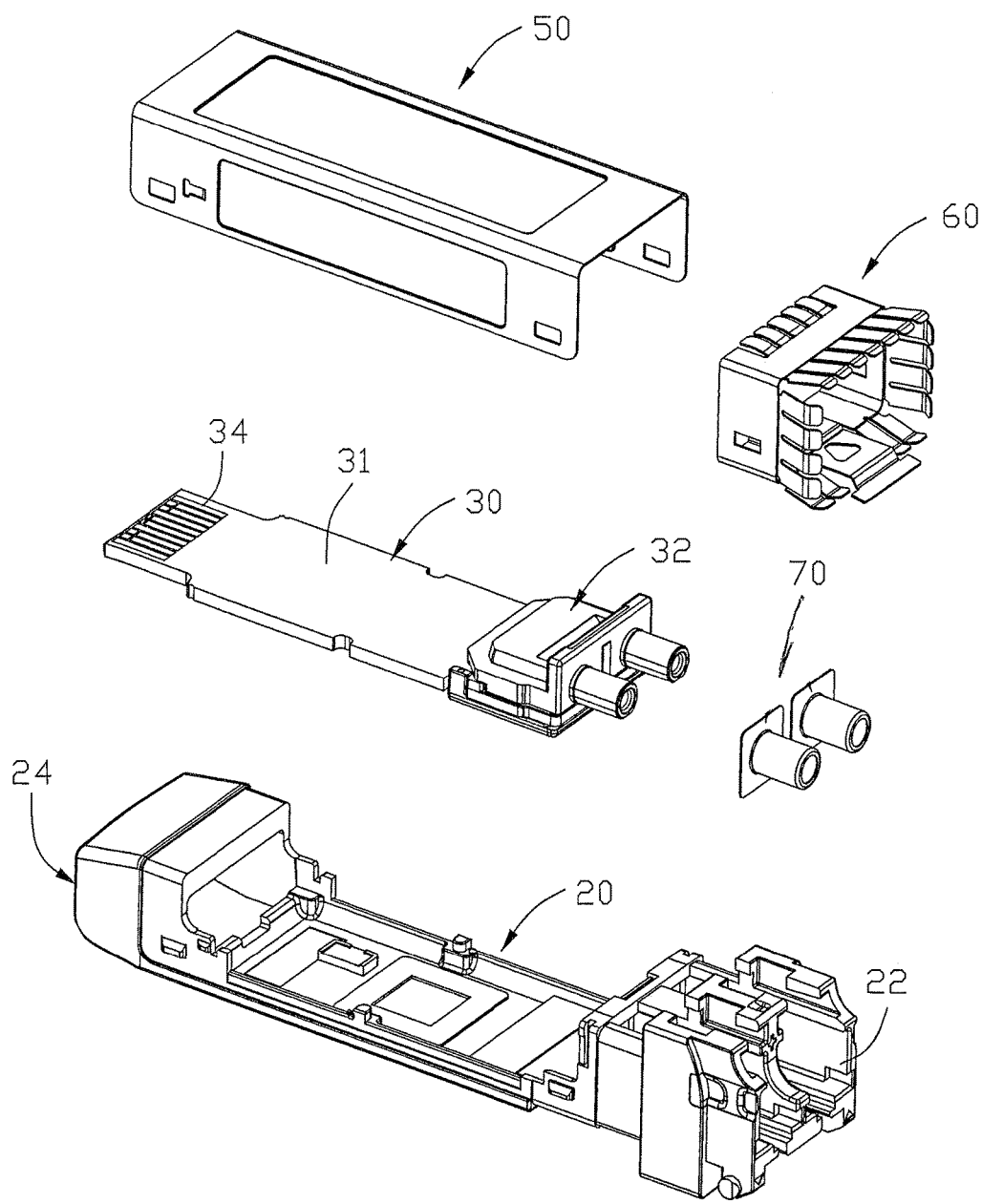
FIG. 7 is an exploded perspective view of the SFP+ transceiver of FIG.
Figure 8:
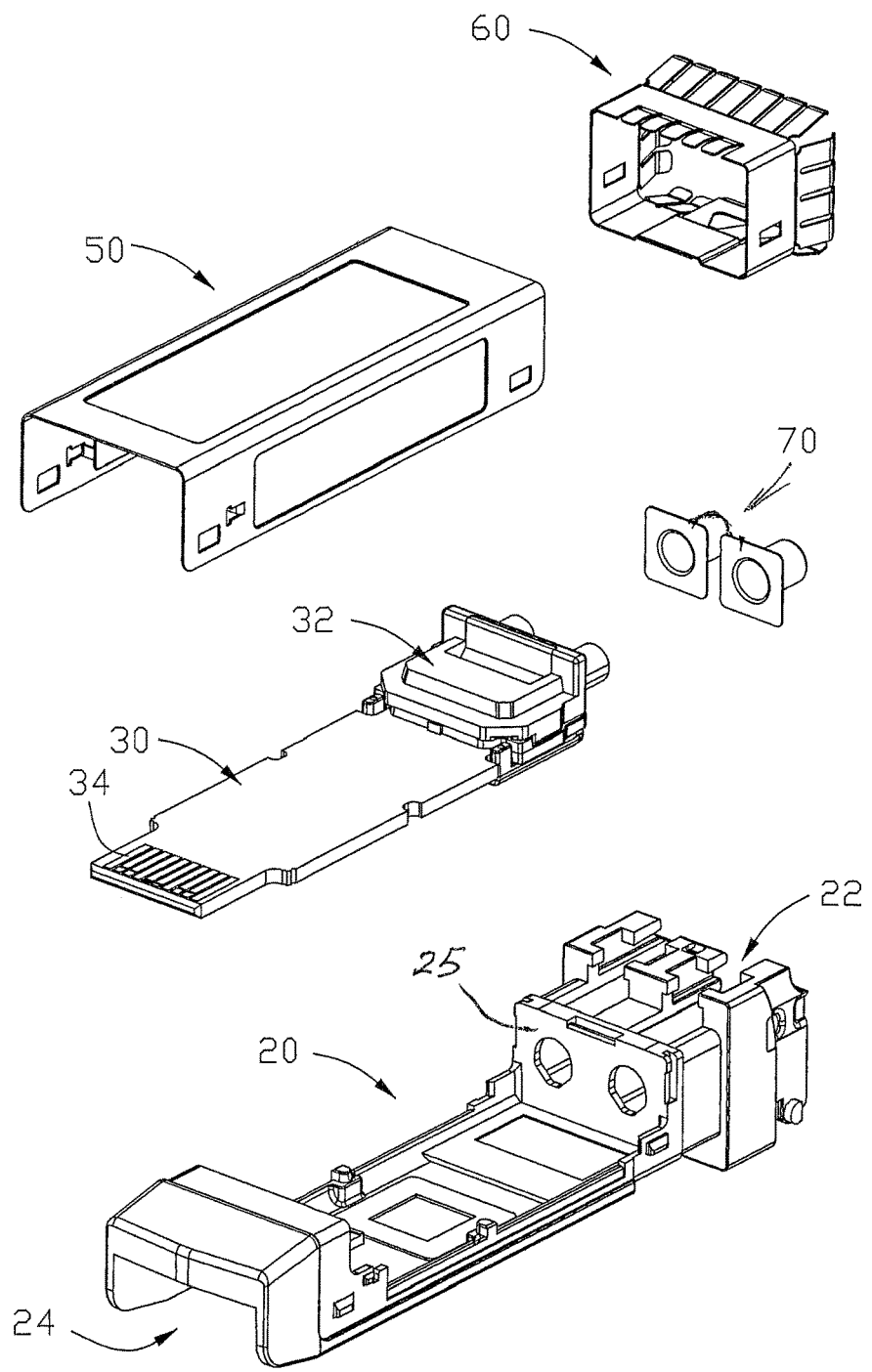
FIG. 8 is another exploded perspective view of the SFP+ transceiver of FIG. 7.
Figure 9:
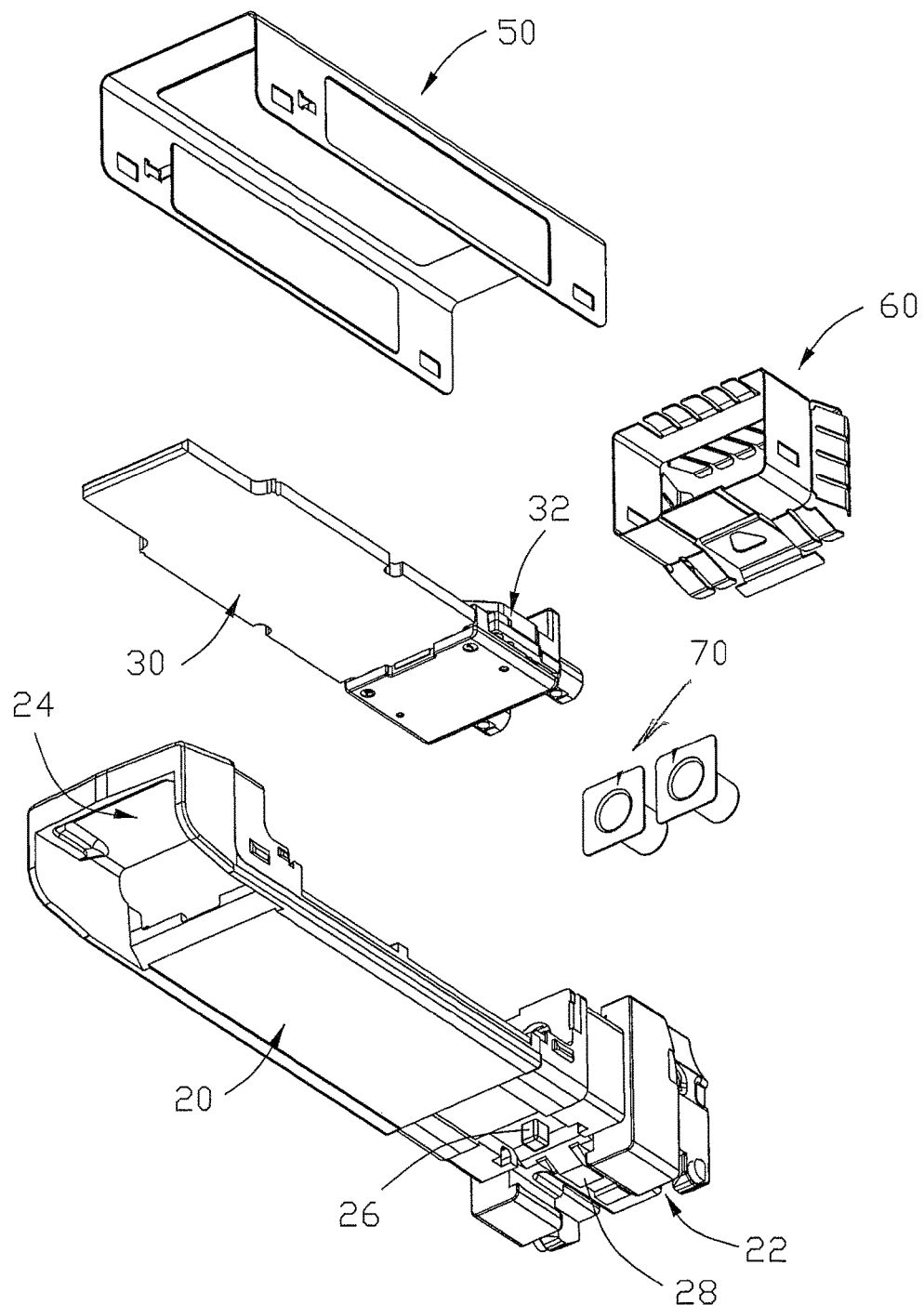
FIG. 9 is another exploded perspective view of the SFP+ transceiver of FIG. 7.
Figure 10:
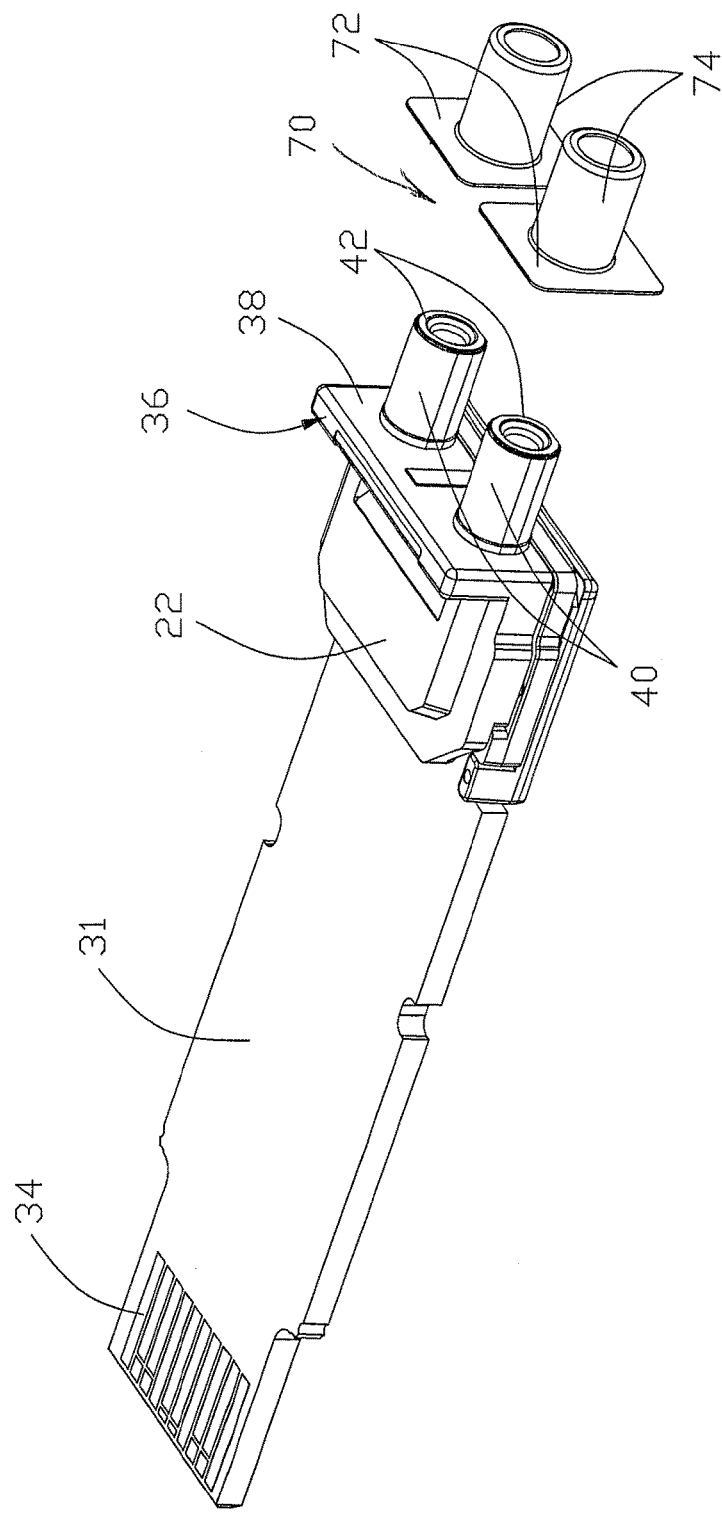
FIG. 10 is an exploded perspective view of the printed circuit board assembly of the SFP+ transceiver of FIG. 7
Figure 11:
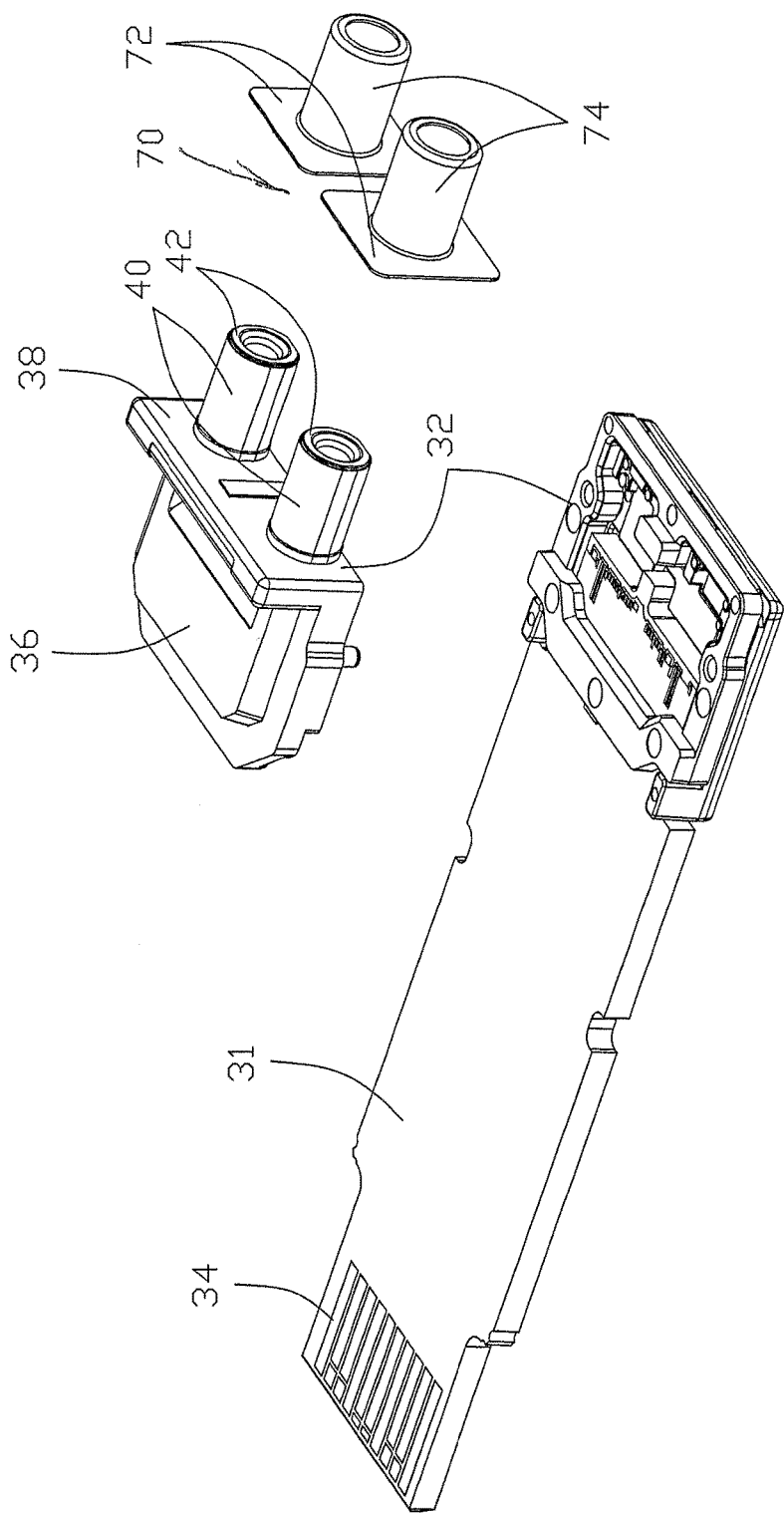
FIG. 11 is a further exploded perspective view of the printed circuit board assembly of the SFP+ transceiver of FIG. 10.
Figure 11A:
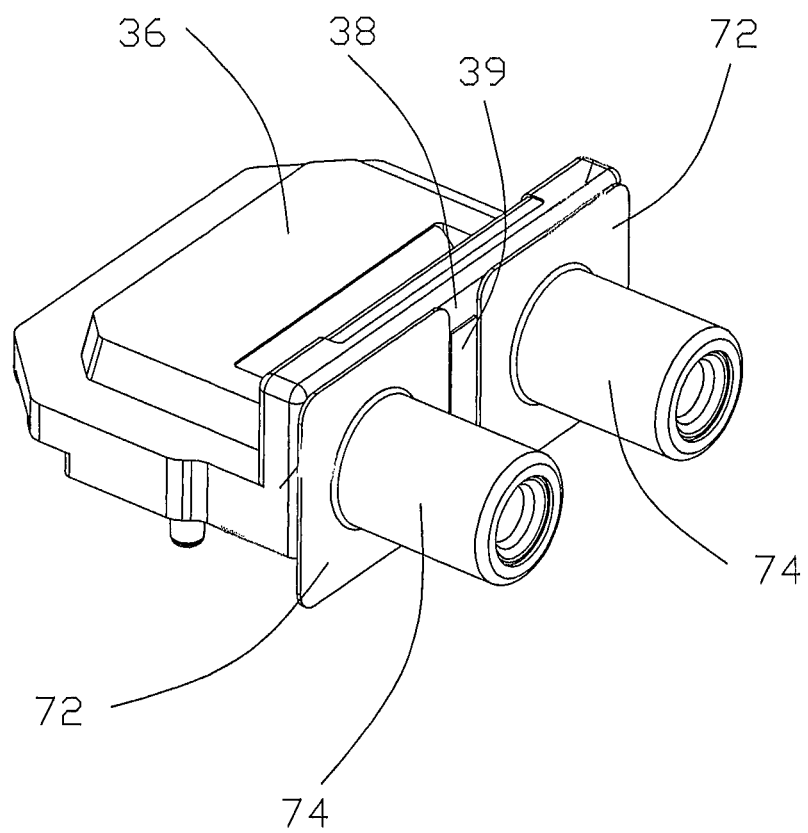
FIG. 11(A) is an assembled perspective view showing the lens structure with the EMI shielding device thereon of FIG. 11.
Figure 12:
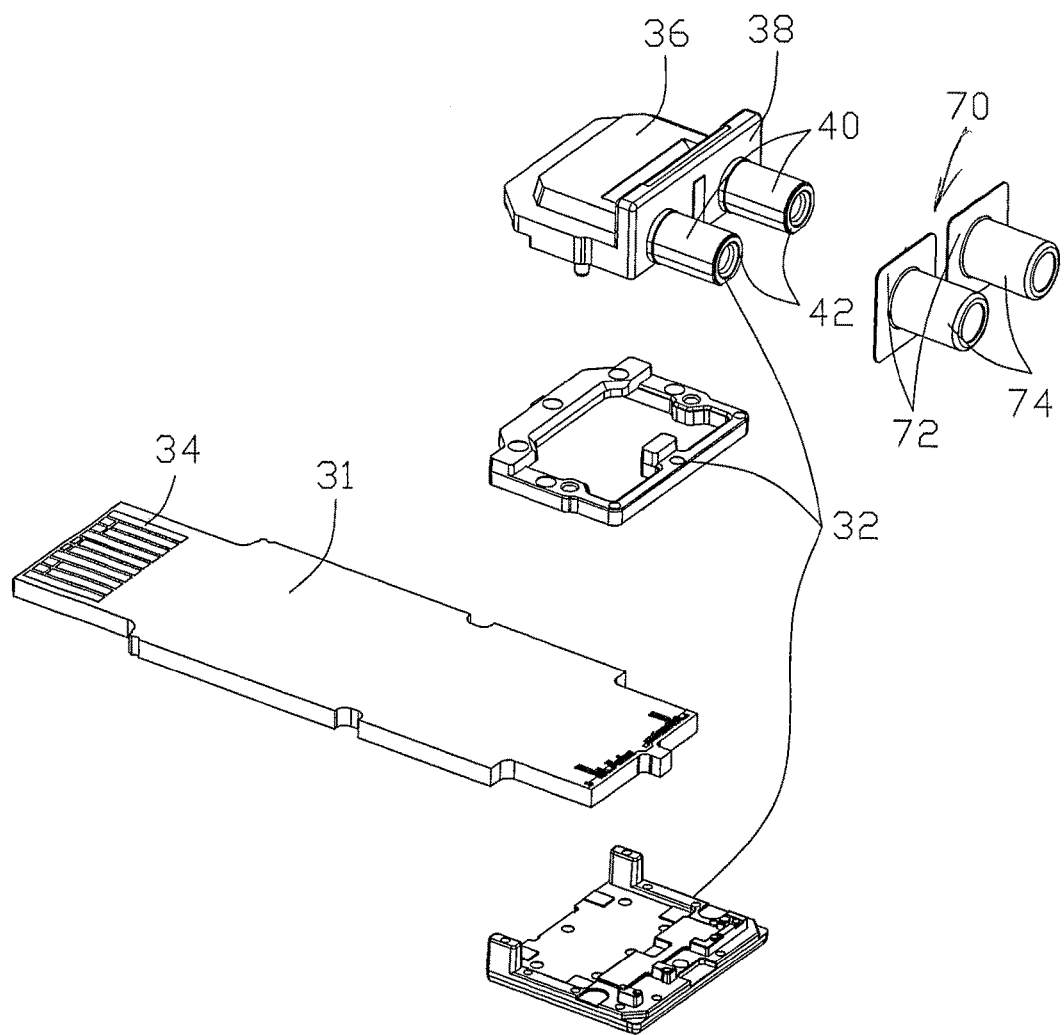
FIG. 12 is a further exploded perspective view of the printed circuit board assembly of the SFP+ transceiver of FIG. 11.
Figure 13:
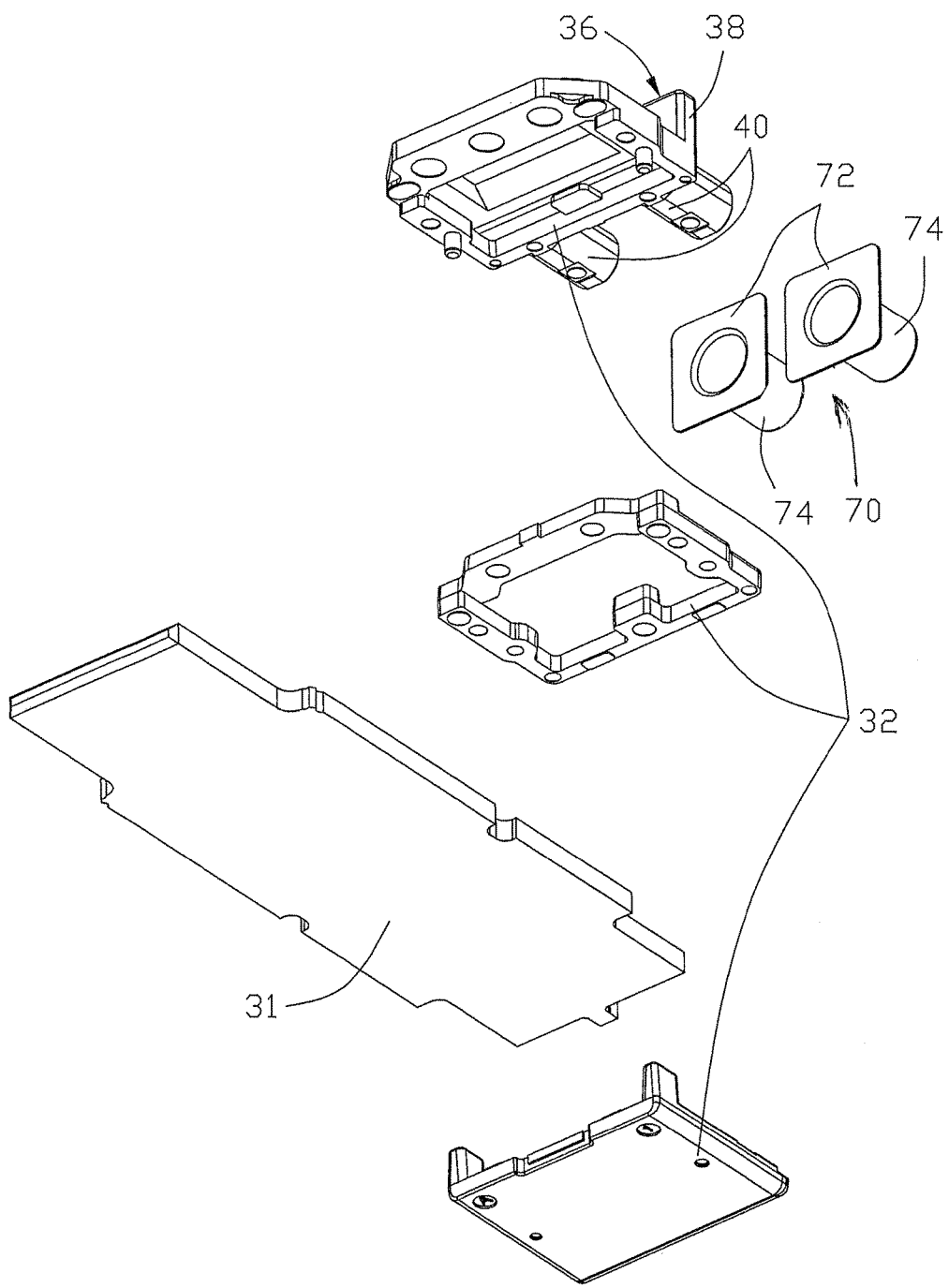
FIG. 13 is another further exploded perspective view of the printed circuit board assembly of the SFP+ transceiver of FIG. 11.
Figure 14B:
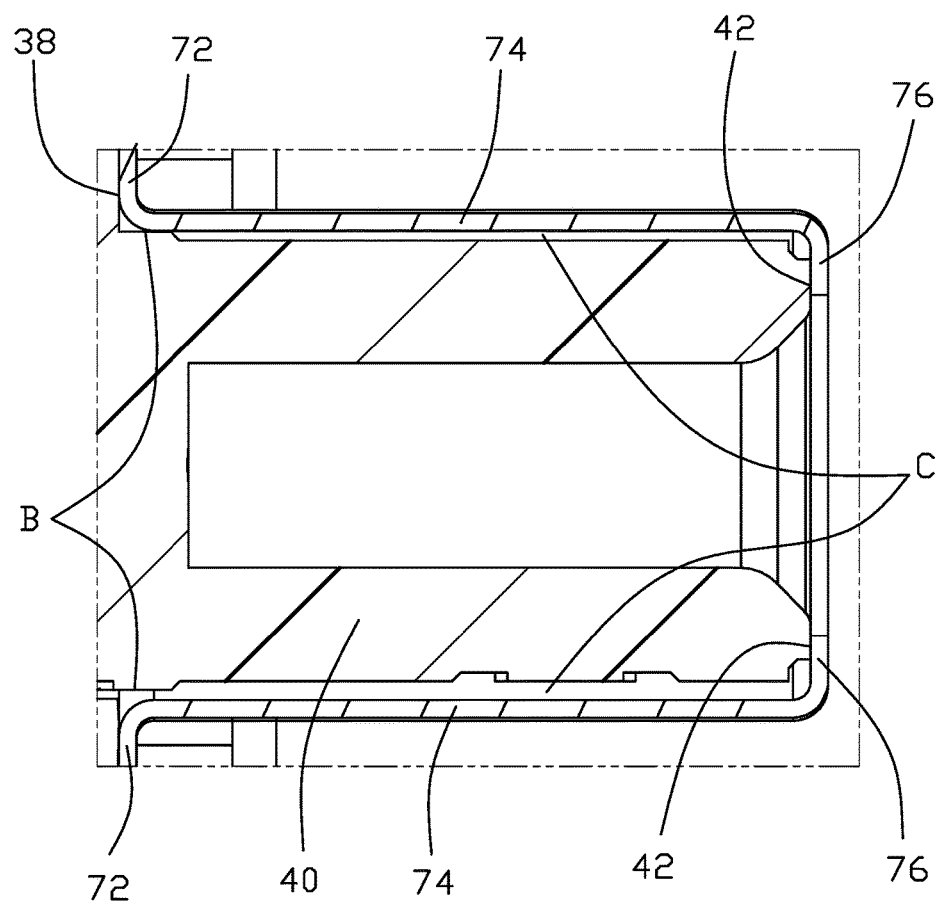
FIG. 14(B) is a further partially enlarged cross-sectional view of the SFP+ transceiver of FIG. 14.
Figure 15:
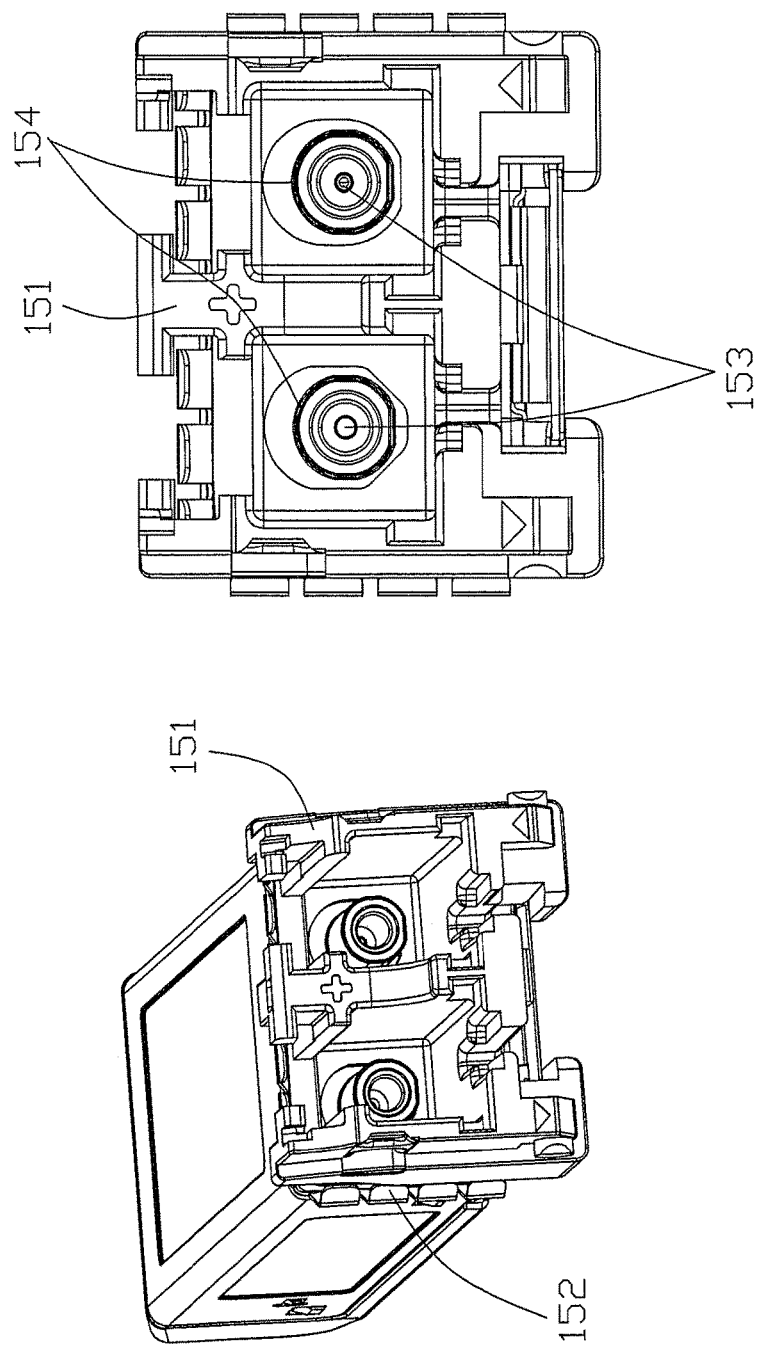
FIG. 15 shows the optical lens module.

Referring to FIG. 14(B), another feature of the instant invention is have the contacting interface between the tubular structure 40 and the tubular sleeve 74 occur only upon a portion B of the whole length along the axial direction so as to minimize the deformation risk of the tubular structure 40 due to interference therebetween, thus assuring interoperability during mating with the LC type optical connector. In other words, there is a circumferential space C between the tubular structure 40 and the tubular sleeve 74 along the axial direction mostly. In this embodiment, the attachment between the lens structure 32 and the EMI shielding device 70 can be optionally achieved by adhesives with or without the aforementioned minor interference fit therebetween. As shown in FIG. 18, in the present embodiment, the tubular structure 40 defines a circle of convex 182 adjacent to the forward face 38. The convex 182 is intervened with the inside wall of the tubular sleeve 74. Referring to FIG. 4(A), one feature of the invention is to have the plate 72 sandwiched between the vertical wall 25 of the die-casting housing 20 and the forward face 38 of the lens structure 36 in the front-to-back direction for retaining the shielding device 70 in position, other than the interference on the portion B. Therefore, the shielding device 70 can not move relative to the housing 20 and the lens structure 36 in the front-to-back direction. It should be noted that the retention between the shielding device 70 and the lens structure 36 should be handled delicately for not substantially deforming the original structure or dimension of the insulative lens structure 36. It is because the insulative lens structure 36 is more sensitive to the lens or fibers, compared with the insulative housing to the contacts or conductors in the electrical connector. In the embodiment, referring to FIG. 11(A), a protrusion 39 is formed on the forward face 38 of the lens structure 36 so as to not only divide the pair of plates 72 but also abut against the side edges of the corresponding plates 72 of the shielding device 70 for preventing the corresponding tubular sleeve 74 from rotating upon the corresponding tubular structure 40.

What is claimed is:

1. A SFP (Small Form Factor Pluggable) transceiver comprising:
   a metallic housing and a metallic upper cover assembled to each other to commonly define a receiving cavity therebetween;
   a mating port defined at one end of the housing for coupling to an optical connector;
   a printed circuit board assembly disposed in the receiving cavity and including:
   a printed circuit board with an insulative lens structure around the mating port, said lens structure including a forward face with a pair of tubular structures forwardly extending therefrom in a front-to-back direction;

a metallic EMI (Electromagnetic Interference) shielding device including a plate with a pair of tubular sleeves forwardly extending therefrom, wherein the plate covers the forward face in the front-to-back direction, and the sleeves respectively cover the whole tubular structures circumferentially and continuously and fully for complete EMI shielding, and the plate is disposed between the forward face of the insulative lens structure and the metallic housing in the front-to-back direction; wherein the tubular sleeves of the shielding device are exposed outside of the tubular structures of the lens structure; wherein both the tubular structures and the tubular sleeves are cylindrically compliant.

2. The SFP transceiver as claimed in claim 1, wherein the sleeve is further equipped with a flange to cover a ring type front end face of the tubular structure in the front-to-back direction.

3. The SFP transceiver as claimed in claim 1, wherein an interference fit occurs on an interface between the sleeve and the tubular structure around a root of the tubular structure in the front-to-back direction.

4. The SFP transceiver as claimed in claim 3, wherein a circumferential space is formed between the tubular structure and the sleeve along an axial direction of the sleeve.

5. The SFP transceiver as claimed in claim 4, the attachment between the lens structure and the EMI shielding device can be optionally achieved by adhesives with or without the aforementioned minor interference fit therebetween.

6. The SFP transceiver as claimed in claim 3, wherein the optical connector includes a pair of fiber ferrules on a back end of thereof, to be inserted into the corresponding tubular structure, and the portion on an interface between the sleeve and the tubular structure is moved completed clear from where the fiber ferrules of the optical connector needs to insert.

7. The SFP transceiver as claimed in claim 6, wherein the portion on an interface between the sleeve and the tubular structure is defined on the rest of the length of the tubular structure except where the fiber ferrules of the optical connector needs to insert.

8. The SFP transceiver as claimed in claim 3, wherein the tubular structure defines a convex adjacent to the front face, and the convex is intervened with inside wall of the sleeve.

9. The SFP transceiver as claimed in claim 1, wherein the housing and the sleeve together form a ring type gap around a root of the sleeve while the plate shields said gap in the front-to-back direction.

10. The SFP transceiver as claimed in claim 1, wherein the plate of the metallic EMI shielding device includes two parts, and each of said two parts corresponds to one corresponding sleeve.

11. The SFP transceiver as claimed in claim 10, wherein a protruding divider is formed on the front face to separate said two parts.

12. The SFP transceiver as claimed in claim 1, wherein said housing is made by die-casting with different thicknesses on different positions while the upper cover is made by forming sheet metal with equal thickness thereof.

13. A SFP (Small Form Factor Pluggable) transceiver comprising:

a metallic housing made by a die-casting process and a metallic upper cover made by forming sheet metal, the metallic housing and the metallic upper cover being assembled to each other to define a receiving cavity therebetween;

a mating port defined at one end of the housing for coupling to an optical connector;

a printed circuit board assembly disposed in the receiving cavity and including:

a printed circuit board with an insulative lens structure around the mating port, said lens structure including a forward face with at least one tubular structure forwardly extending therefrom in a front-to-back direction;

a metallic EMI (Electromagnetic Interference) shielding device including a plate with at least one tubular sleeve forwardly extending therefrom, wherein the plate covers the forward face in the front-to-back direction, and the sleeve respectively cover the whole tubular structures circumferentially and continuously and fully for complete EMI shielding, and the plate is disposed between the forward face of the insulative lens structure and the metallic housing in the front-to-back direction; wherein the tubular sleeves of the shielding device are exposed outside of the tubular structures of the lens structure; wherein both the tubular structures and the tubular sleeves are cylindrically compliantly compliant.

14. The SFP transceiver as claimed in claim 13, wherein the housing includes a vertical wall around the mating port, and said vertical wall is radially spaced from the sleeve with a gap while abuts against the plate in the front-to-back direction.

15. The SFP transceiver as claimed in claim 14, wherein said plate is sandwiched between the vertical wall of the housing and the front face of the lens structure in the front-to-back direction.

16. The SFP transceiver as claimed in claim 13, wherein said front face includes a protrusion abutting against a corresponding edge of the plate for preventing rotation of the shielding device upon the lens structure about an axis along which the sleeve extends.

17. The SFP transceiver as claimed in claim 13, wherein an interference fit occurs between only a portion of the sleeve and a corresponding portion of the tubular structure.

18. A SFP (Small Form Factor Pluggable) transceiver comprising:

a metallic housing made by a die-casting process and a metallic upper cover made by forming sheet metal, the metallic housing and the metallic upper cover being assembled to each other to define a receiving cavity therebetween;

a mating port defined at one end of the housing for coupling to an optical connector;

a printed circuit board assembly disposed in the receiving cavity and including:

a printed circuit board with an insulative lens structure around the mating port, said lens structure including a forward face with at least one tubular structure forwardly extending therefrom in a front-to-back direction and configured and sized to receive a fiber ferrule of the optical connector; and a metallic EMI (Electromagnetic Interference) shielding device including a plate with at least one tubular sleeve forwardly extending therefrom, wherein the plate covers the forward face in the front-to-back direction, and the sleeve respectively cover the whole tubular structures circumferentially and continuously and fully for complete EMI shielding, and the plate is disposed between the forward face of the insulative lens structure and the metallic housing in the front-to-back direction; wherein the tubular sleeves of the shielding device are exposed outside of the tubular structures of the lens structure; wherein both the tubular structures and the tubular sleeves are cylindrically compliant.

19. The SFP transceiver as claimed in claim 18, wherein an interference fit occurs between only a portion of the sleeve and a corresponding portion of the tubular structure.

20. The SFP transceiver as claimed in claim 18, wherein the sleeve is further equipped with a flange to cover a ring type front end face of the tubular structure in the front-to-back direction.

* * * * *